US009922703B2

(12) United States Patent
Ishii et al.

(10) Patent No.: US 9,922,703 B2
(45) Date of Patent: Mar. 20, 2018

(54) MULTIPORT MEMORY, MEMORY MACRO AND SEMICONDUCTOR DEVICE

(71) Applicant: Renesas Electronics Corporation, Tokyo (JP)

(72) Inventors: Yuichiro Ishii, Tokyo (JP); Makoto Yabuuchi, Tokyo (JP); Masao Morimoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/481,345

(22) Filed: Apr. 6, 2017

(65) Prior Publication Data

US 2017/0358344 A1 Dec. 14, 2017

(30) Foreign Application Priority Data

Jun. 8, 2016 (JP) .................................. 2016-114270

(51) Int. Cl.
| | |
|---|---|
| *G11C 11/00* | (2006.01) |
| *G11C 11/419* | (2006.01) |
| *G11C 11/418* | (2006.01) |
| *G11C 8/16* | (2006.01) |
| *G11C 7/22* | (2006.01) |
| *G11C 7/10* | (2006.01) |
| *G11C 8/00* | (2006.01) |
| *G11C 8/18* | (2006.01) |
| *G11C 7/00* | (2006.01) |

(52) U.S. Cl.
CPC .............. *G11C 11/419* (2013.01); *G11C 7/00* (2013.01); *G11C 7/10* (2013.01); *G11C 7/22* (2013.01); *G11C 8/00* (2013.01); *G11C 8/16* (2013.01); *G11C 8/18* (2013.01); *G11C 11/418* (2013.01)

(58) Field of Classification Search
CPC ....... G11C 11/419; G11C 11/418; G11C 7/00; G11C 7/10; G11C 7/22; G11C 8/00; G11C 8/16; G11C 8/18
See application file for complete search history.

(56) References Cited

U.S. PATENT DOCUMENTS

| | | | |
|---|---|---|---|
| 6,519,187 B2 * | 2/2003 | Wada | G11C 7/1006 365/189.02 |
| 7,251,193 B2 * | 7/2007 | Jung | G11C 7/1012 365/189.16 |
| 2003/0081449 A1 | 5/2003 | Beucler | |

(Continued)

*Primary Examiner* — Toan Le
(74) *Attorney, Agent, or Firm* — McGinn IP Law Group, PLLC

(57) ABSTRACT

A multiport memory includes an address control circuit, a memory array, a data input-output circuit and a control circuit and first and second address signals and a clock signal are input through two ports. The address control circuit includes first and second latch circuits, a selection circuit, a decode circuit and a word line drive circuit. The first address signal input through one port is input into the first latch circuit and the second address signal input through the other port is input into the selection circuit. The selection circuit selects one of the first and second address signals, the second latch circuit latches and outputs the selected address signal to the decode circuit. The word line drive circuit drives a word line on the basis of an output signal from the decode circuit.

15 Claims, 13 Drawing Sheets

(56) References Cited

U.S. PATENT DOCUMENTS

| | | | |
|---|---|---|---|
| 2005/0219930 A1* | 10/2005 | Takahashi | G11C 11/406 365/222 |
| 2009/0231937 A1 | 9/2009 | Jung et al. | |
| 2013/0194882 A1* | 8/2013 | Ishii | G11C 7/222 365/194 |
| 2014/0153349 A1* | 6/2014 | Wu | G11C 7/1039 365/203 |

* cited by examiner

MULTIPORT MEMORY, MEMORY MACRO AND SEMICONDUCTOR DEVICE

CROSS-REFERENCE TO RELATED APPLICATIONS

The disclosure of Japanese Patent Application No. 2016-114270 filed on Jun. 8, 2016 including the specification, drawings and abstract is incorporated herein by reference in its entirety.

BACKGROUND

The present invention relates to a multiport memory, a memory macro and a semiconductor device and is preferably utilized in, in particular, the multiport memory which includes a port which pseudoly functions as two ports so as to make physical access to one port look like access to two ports, the memory macro used for the multiport memory described above and the semiconductor device onto which the multiport memory is loaded.

A pseudo 2-port SRAM which pseudoly realizes a function of a 2-port SRAM by using a memory macro of a single-port SRAM (Static Random Access memory) is widely used mainly in the field of image processing. This pseudo 2-port SRAM is of the type of realizing the function of the 2-port SRAM by continuously operating (at first, a reading operation and then a writing operation are performed) the single-port SRAM two times in one cycle. This pseudo 2-port SRAM uses a memory cell of the single port SRAM which is smaller than a memory cell of the 2-port SRAM as the memory cell thereof and therefore is area-efficient. On the other hand, it is requested to increase an operating frequency in order to operate an internal circuit of the pseudo 2-port SRAM at a speed multiplied by two.

Specific circuits for the pseudo 2-port SRAM are disclosed in U.S. Unexamined Patent Application Publication Nos. 2003/0081449 and 2009/0231937. In the pseudo 2-port SRAM which is disclosed in U.S. Unexamined Patent Application Publication No. 2003/0081449, a read-address signal (355) at one port and a write address signal (365) at the other port are respectively fetched into two address registers (311 and 310) and one of the read-address and write-address signals is selected by an address multiplexer (315) and is supplied to a row decoder (316) and a column decoder (325) (see FIG. 3 of U.S. Unexamined Patent Application Publication No. 2003/0081449).

In the pseudo 2-port SRAM which is described in U.S. Unexamined Patent Application Publication No. 2009/0231937, address signals which are input through a read port and a write port are respectively fetched into a read-port address latch (101) and a write-port address latch (102) and one of the address signals is selected by a multiplexer (104) and is supplied to a pre-decoder (106) (see FIG. 1 of U.S. Unexamined Patent Application Publication No. 2009/0231937).

SUMMARY

As a result of investigations that the inventors and others of the present invention have made on U.S. Unexamined Patent Application Publication Nos. 2003/0081449 and 2009/0231937, it was found that there exist new matters to be solved as follows.

The pseudo 2-port SRAM includes a memory mat of a single port SRAM, an address control circuit having two address input ports, a data input-output circuit and a control circuit. In the memory mat, memory cells of the single port SRAM are arranged on parts where a plurality of word lines which extend in a row direction intersects with a plurality of bit line pairs (or a plurality of bit lines) which extend in a column direction. The address control circuit decodes address signals of two systems which are input through the two ports respectively and selects and drives the word line which corresponds to the signal concerned. The memory cell which is coupled to the selected and driven word line is made accessible from the data input-output circuit. The data input-output circuit once latches the address signals of two systems which are input through the two ports and then sequentially supplies the address signals to an address decoder in order to perform assessing such as a reading operation, a writing operation and so forth two times in a one-clock cycle.

FIG. 6 is a circuit diagram illustrating one configurational example of an address control circuit used for investigations of the matters to be solved which are common between the related art pseudo 2-port SRAMs described in U.S. Unexamined Patent Application Publication Nos. 2003/0081449 and 2009/0231937. FIG. 7 is a timing chart illustrating one example of an operation of the address control circuit in FIG. 6.

The address control circuit 10 includes two latch circuits 1 and 2, a selection circuit 3, a decode circuit 4 and a word-line drive circuit 5 and address signals AA and AB of two systems are input through two ports (A port and B port) and are output to word lines which include illustrated word lines WL_AA and WL_AB. Although each of the address signals AA and AB is configured by a plurality of bits, only circuits each for one bit are illustrated in the drawing. CPCTL, SEL and CPA are control signals which are generated by a control circuit. The address signals AA and AB are respectively latched by the latch circuits 1 and 2 in synchronization with the control signal CPCTL. As illustrated in the drawing, the selection circuit 3 may be configured by two clocked inverters and one inverter and supplies one of the address signals AA and AB to the decode circuit 4 as an internal address signal LTA on the basis of the control signal SEL. Also an address signal of other bits whose illustration is omitted is input into the decode circuit 4 and the decode circuit 4 decodes the address signal so input and selects one of the plurality of word lines. The selected word line is a word line which corresponds to a value of the address signal and is driven by the word line drive circuit 5. The control signal CPA is a control signal which controls a timing that the word line is driven.

The operation of the address control circuit 10 will be described with reference to FIG. 7. The A port corresponds to the write port and the B port corresponds to the read port, and the writing operation at the A port is executed after execution of the reading operation at the B port.

First, an external clock signal CLOCK rises at a time T0. Thereby, the address latch control signal CPCTL is activated and the address signals AA and AB are respectively latched by the latch circuits 1 and 2. Then, at a time T1, the word line control signal CPA is activated. At this time, since the selection control signal SEL is at a Low level, the selection circuit 3 selects the B port side address signal and the B port side address signal AB is output as the internal address signal LTA. In association with this operation, the word line which corresponds to the address that the address signal AB indicates is selected by the decode circuit 4 and the corresponding word line WL_AB is driven and activated by the word line drive circuit 5. Then, at a time T2, the word line control signal CPA is inactivated and then the word line WL_AB is inactivated.

Then, at a time T3, the selection control signal SEL is transitioned to a High level. Thereby, the selection circuit 3 selects the A port side address signal. Since the A port side address signal AA is output as the internal address signal LTA, the word line which corresponds to the address that the address signal AA indicates is selected by the decode circuit 4. Then, at a time T4, the word line control signal CPA is activated and the word line WL_AA which corresponds to the address signal AA is driven and activated by the word line drive circuit 5. Then, at a time T5, the word line control signal CPA is inactivated and the word line WL_AA is inactivated.

Then, at a time T6, the address latch control signal CPCTL is inactivated and the latch circuits 1 and 2 return to through states. In addition, the selection control signal SEL transitions to the Low level and returns to an initial state.

As a result of the foregoing, the one-cycle operation of the pseudo 2-port SRAM is terminated.

The disadvantage of the related art circuit as mentioned above lies in the point that the timing that the selection control signal SEL transitions from the Low level to the High level (the time T3) is strict. First, it is requested to satisfy a hold time for a first-time transition (the time T2) from the High level to the Low level of the word line control signal CPA. When the hold time is not satisfied, the word line which is selected on the basis of the A port side address signal AA is erroneously activated and malfunctions in first time activation of the word line. Then, it is requested to satisfy a setup time for a second-time transition (the time T4) from the Low level to the High level of the word line control signal CPA. When the setup time is not satisfied, the word line which is selected on the basis of the B port side address signal AB is erroneously activated and malfunctions in second-time activation of the word line.

As described above, in the related art, it is requested to set a switching timing of the selection control signal SEL so as to satisfy timing constraints on both of the setup time and the hold time relative to the word line control signal CPA. This hinders promotion of improvement of the operating frequency of the pseudo 2-port SRAM.

In the multiport memory which includes the single memory port which operates as the plurality of ports pseudoly in this way, it is requested to relax the timing constraints on the operation of the single memory port as the plurality of pseudo ports in order to improve the operating frequency of the pseudo 2-port SRAM.

Although, in the following, measures for solving the matters as mentioned above will be described, other matters to be solved and novel features of the present invention will becomes apparent from the description of the present specification and the appended drawings.

The present invention has been made in view of the above mentioned circumstances and aims to provide a multiport memory, a memory macro used for the multiport memory and a semiconductor device onto which the multiport memory is loaded.

According to one embodiment of the present invention, there is provided a multiport memory which includes an address control circuit, a memory array, a data input-output circuit and a control circuit and into which first and second address signals and a clock signal are input respectively through two ports thereof so as to make inputting or outputting of data possible. The multiport memory is configured as follows.

The address control circuit includes first and second latch circuits, a selection circuit, a decode circuit, and a word line drive circuit. The first address signal which has been input through one port is input into the first latch circuit and the second address signal which has been input through the other port is input into the selection circuit. The selection circuit selects and supplies one of the first address signal which has been latched by the first latch circuit and the second address signal which has been directly input into the selection circuit to the second latch circuit. The second latch circuit latches and outputs the address signal so selected to the decode circuit. An output signal from the decode circuit is supplied to the word line drive circuit and the word line drive circuit drives a word line on the basis of the output signal from the decode circuit.

One of the first and second address signals which has been selected by the selection circuit is decoded by the decode circuit and thereby one of the plurality of word lines that the memory array includes is selected and the word line drive circuit drives and thereby activates the selected word line. The data input-output circuit sets a memory cell which is selected by the one word line so activated in a plurality of memory cells that the memory array includes as an object into and/or from which data is input and/or output. According to embodiments of the present invention, there are also provided a memory macro used for the above-mentioned multiport memory and a semiconductor device which includes the above-mentioned multiport memory.

Incidentally, the first, second and other address signals are configured by a plurality of digital bits each and lines thereof are implemented by a plurality of signal wiring lines, and also the first, second latch and other latch circuits and the selection circuit and so forth which perform latching, selection and other operations on these address signals are circuits which are designed so as to cope with a plural-bit configuration of each signal. This is the same throughout the specification.

The advantageous effect which is brought about by the above-mentioned embodiments is as follows when briefly described.

That is, in the multiport memory which includes a single memory port which operates as a plurality of ports pseudoly, the timing restraints are relaxed and therefore it is possible to improve the operating frequency of the multiport memory.

DETAILED DESCRIPTION

Preferred embodiments of the present invention will be described in detail. Incidentally, in all of the drawings used to describe the modes for carrying out the invention, the same numerals are assigned to the elements having the same functions and repetitive description thereof is omitted.

First Embodiment

Figure 1:
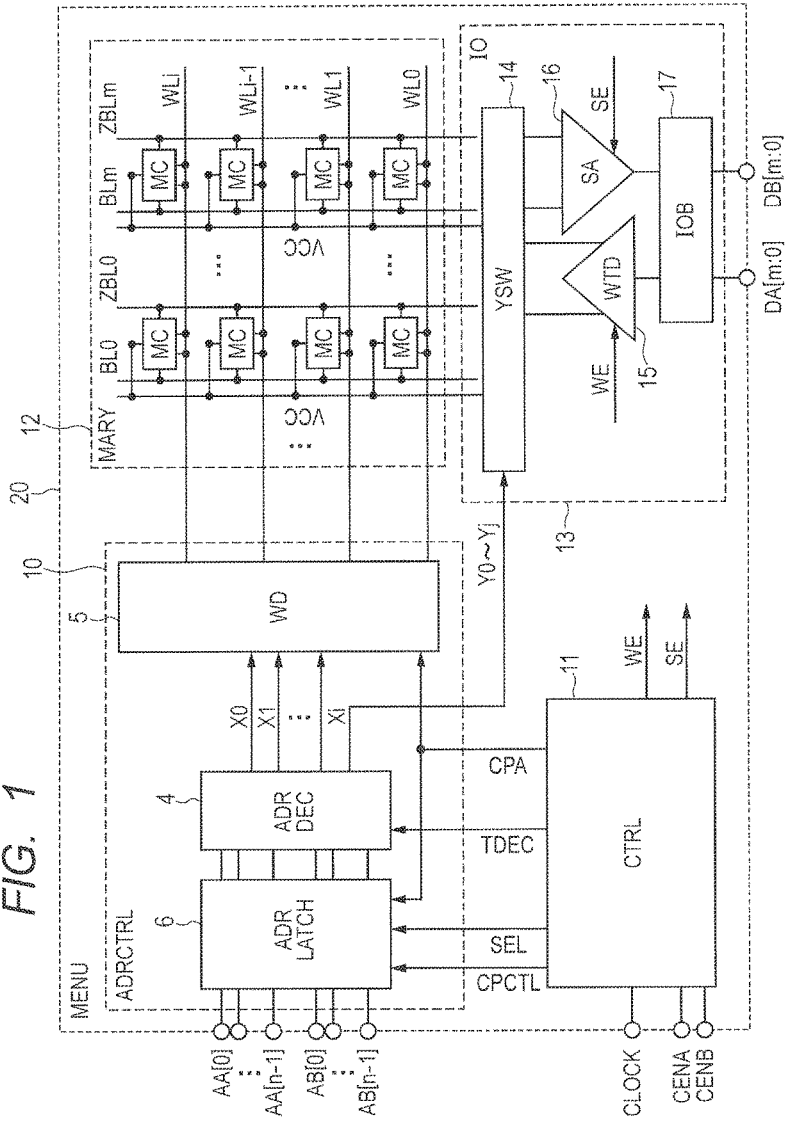
FIG. 1 is a block diagram illustrating one configurational example of a pseudo 2-port SRAM.

FIG. 1 is a block diagram illustrating one configurational example of a pseudo 2-port SRAM (MEMU 20). In the memory unit MEMU 20 of the pseudo 2-port SRAM, an A port address signal (terminal) AA [n−1:0], a B port address signal AB (terminal) AB [n−1:0], a clock signal (terminal) CLOCK, chip enable signals (terminals) CENA and CENB, and an A port side data signal (terminal) DA [m:0] are input and a B port side data signal (terminal) DB [m:0] is output. Here, "[n−1:0] " is a notation which indicates a digital signal lines of a plurality of bits and denotes signal lines of n bits (n lines) from an (n−1)-th bit to a 0-th bit.

The memory unit MEMU 20 includes an address control circuit (ADRCTRL) 10, a memory array (MARY) 12, a data input-output circuit (IO) 13, a control circuit (CTL) 11 and so forth. The memory array (MARY) 12 includes a plurality of memory cells MC which are respectively arranged in the vicinity of intersection points between i+one word lines WL0 to WLi which extend in a row direction and m+one bit line pairs BL0/ZBL0 to BLm/ZBLm which extend in a column direction which intersects with the row direction (i and m are one or more integers each). Each bit line pair is configured by two bit lines (for example, BL0 and ZBL0) which transfer complementary signals. The plurality of memory cells MC are coupled to the i+one word lines and the m+one bit line pairs such that one memory cell MC is coupled to one word line and one bit line pair. The data input-output circuit (IO) 13 includes a column selection circuit (YSW) 14, a write drive circuit (WTD) 15, a sense amplifier (SA) 16, an input-output buffer (IOB) 17 and so forth. The control circuit (CTL) 11 generates various kinds of control signals CPCTL, SEL, TDEC, CPA, WE, SE and so forth on the basis of the clock signal CLOCK and the chip enable signals CENA and CENB which are input and supplies the generated signals to the corresponding circuits.

The address control circuit 10 includes a latch circuit (ADRLATCH) 6, a decode circuit (ADRDEC) 4, a word line drive circuit (WD) 5 and so forth. The A-port address signal AA (n−1:0) and the B-port address signal AB (n−1:0) are input into the latch circuit (ADRLATCH) 6 and the latch circuit (ADRLATCH) 6 sequentially selects the address signals AA and AB on the basis of the control signals CPCTL, SEL and CPA which are supplied from the control circuit (CTRL) 11 and supplies each of the address signals so selected to the decode circuit (ADRDEC) 4. The decode circuit (ADRDEC) 4 decodes the supplied address signal and outputs decoding results X0 to Xi to the word lie drive circuit (WD) 5 and outputs selection control signals Y0 to Yj to the column selection circuit (YSW) 14.

The column selection circuit (YSW) 14 included in the data input-output circuit (IO) 13 selects an appropriate bit line pair on the basis of the selection control signals Y0 to Yi and designates the corresponding memory cell so as to make the memory cell accessible from the write drive circuit (WTD) 15 or the sense amplifier (SA).

Figure 2:
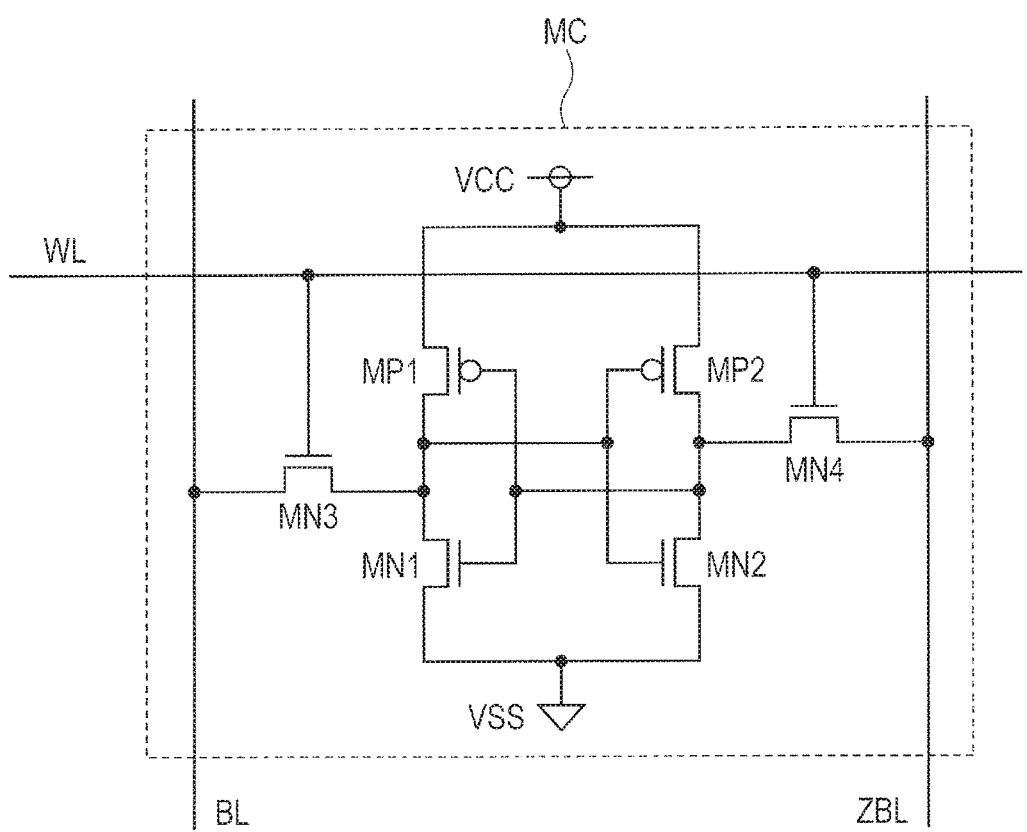
FIG. 2 is a circuit diagram illustrating one configurational example of a single-port SRAM memory cell.

The plurality of memory cells MC which configure the memory array (MARY) 12 each is a single-port SRAM memory cell. FIG. 2 is a circuit diagram illustrating one configurational example of the single-port SRAM memory cell.

Here, the memory cell MC is the SRAM memory cell which includes four N channel MOS (Metal Oxide Semiconductor) transistors MN1 to MN4 and two P channel MOS transistors MP1 and MP2. In the N channel MOS transistor MN3, a gate is coupled to the word line WL and one of a source and a drain is coupled to the positive electrode side bit line BL. In the N channel MOS transistor MN4, a gate is coupled to the word line WL and one of a source and a drain is coupled the negative electrode side bit line ZBL. The MOS transistors MN1 and MP1 and the MOS transistors MN2 and MN2 respectively configure CMOS (Complementary Metal Oxide Semiconductor) inverter circuits between a power voltage source VCC and a ground voltage source VSS. These two CMOS inverter circuits configure one latch circuit by coupling an input terminal of one inverter circuit to an output terminal of the other inverter circuit. The other of the source and the drain of the N channel MOS transistor MN4 is coupled to the input terminal (the output terminal of the CMOS inverter circuit (MN2, MP2)) of the CMOS inverter circuit (MN1, MP1) and the other of the source and the drain of the N channel MOS transistor MN3 is coupled to the input terminal (the output terminal of the CMOS inverter circuit (MN1, MP1)) of the CMOS inverter circuit (MN2, MP2).

Figure 3:
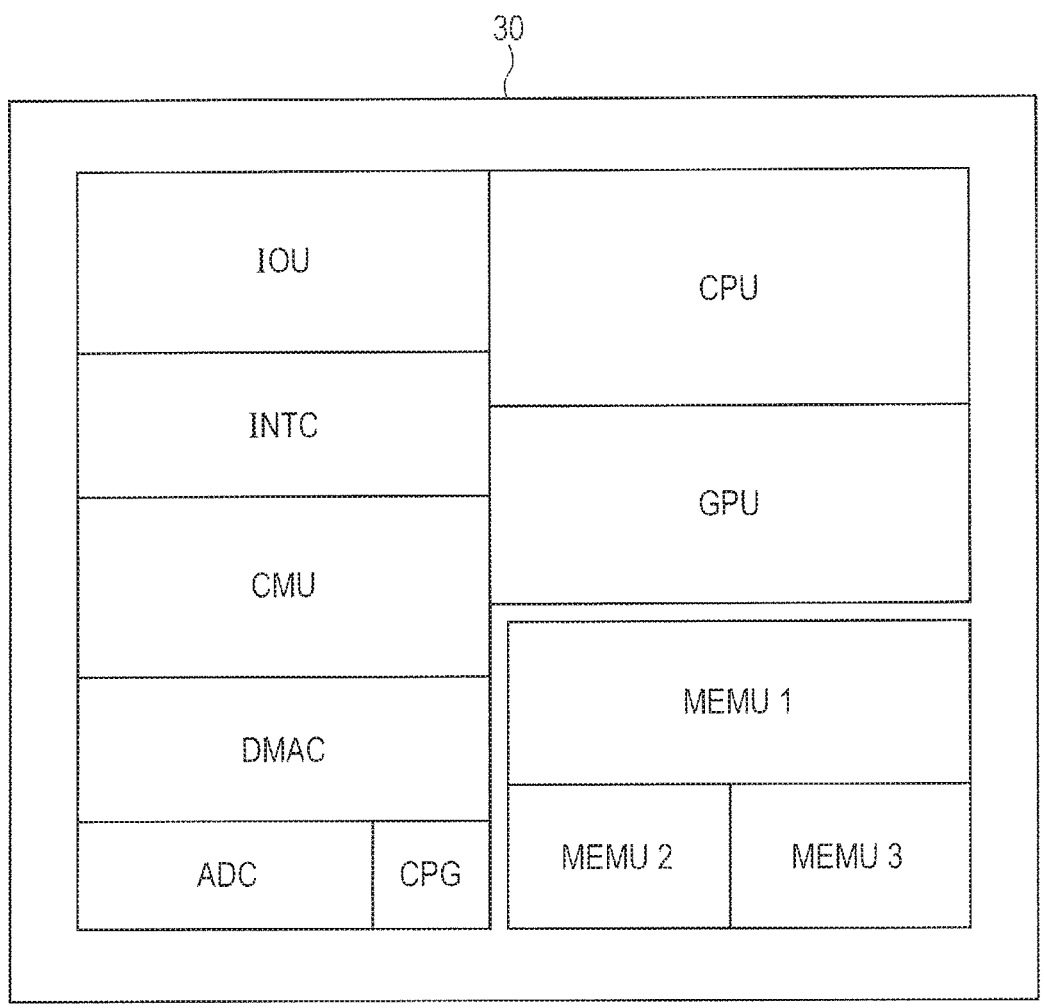
FIG. 3 is an explanatory diagram schematically illustrating one layout configurational example of a semiconductor device (LSI: Large Scale Integrated circuit) onto which the multiport memory is to be loaded.

FIG. 3 is an explanatory diagram schematically illustrating a layout configurational example of a semiconductor device (LSI: Large Scale Integrated circuit) onto which the multiport memory is to be loaded. A semiconductor device 30 is an LSI that various logic circuits and memory circuits have been formed in one semiconductor chip, is also called a microcontroller unit (MCU), a microprocessor unit (MPU), an SOC (System On a Chip) and so forth and is formed on a single semiconductor substrate which is made of silicon and so forth by using, though there is no particular limitation, for example, a well-known CMOSLSI manufacturing technology. The semiconductor device 30 illustrated in FIG. 3 is, for example, an in-vehicle LSI. Though there is no particular limitation, the semiconductor device 30 includes a CPU (Central Processing Unit), a GPU (Graphics Processing Unit), an Input/Output Unit (IOU), an Interrupt Controller (INTC), memory units MEMU 1 to MEMU 3 and so forth. The semiconductor device 30 may further include a Communication Unit (CMU), a Direct Memory Access Controller unit (DMAC), an Analog to Digital Convertor unit (ADC), a Clock Pulse Generator circuit (CPG) and so forth.

The memory unit MEMU 20 is a memory circuit which is mounted on an LSI chip and is generated by an automatic design tool which is called a memory compiler and so forth, for example, by using design data which is called memory IP (Intellectual Property) and so forth in the LSI such as the SOC and so forth and is mounted on the chip.

The memory unit MEMU 20 functions as a 2-port memory by performing both of the reading operation and the writing operation in a one-cycle period of the external clock signal CLOCK. At this time, the address signals AA [n−1:0] and AB [n−1:0] which are input through the two ports are latched by the latch circuit (ADRLATCH) 6 in the address control circuit 10 and are sequentially supplied to the decode circuit (ADRDEC) 4.

The configuration and the operation of the address control circuit 10 will be described in more detail.

Figure 4:
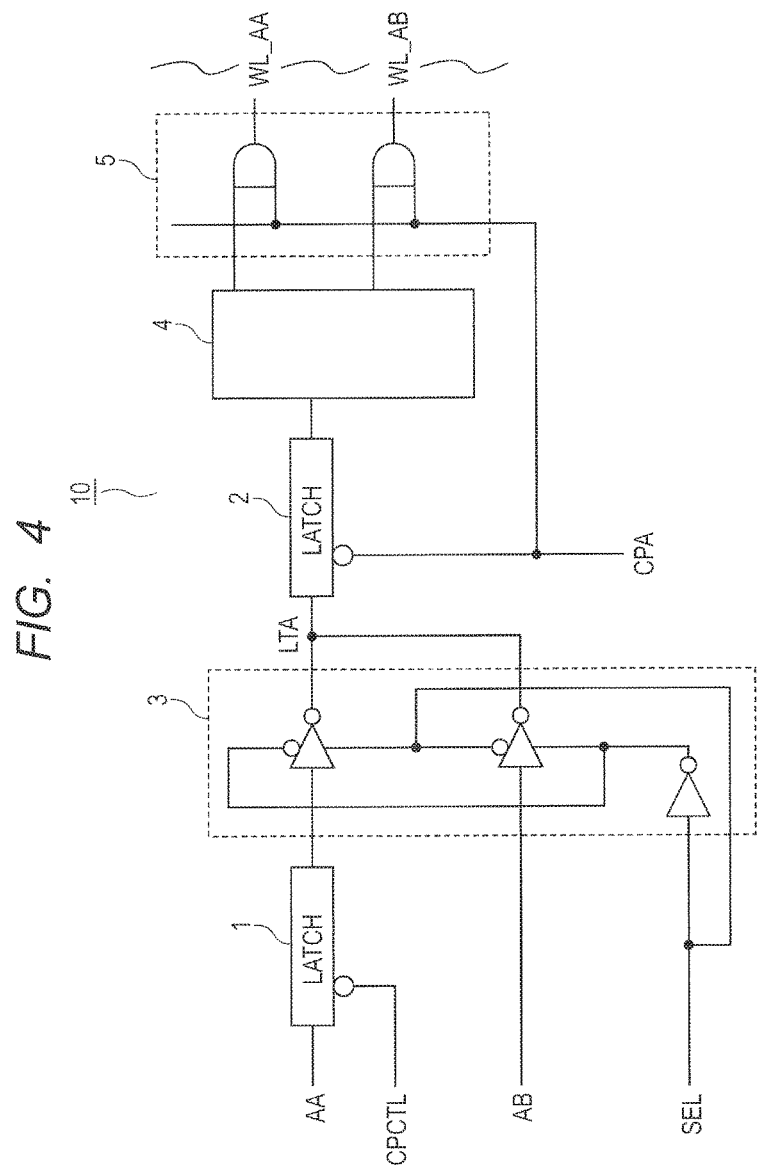
FIG. 4 is a circuit diagram illustrating one configurational example of an address control circuit according to a first embodiment of the present invention
Figure 5:
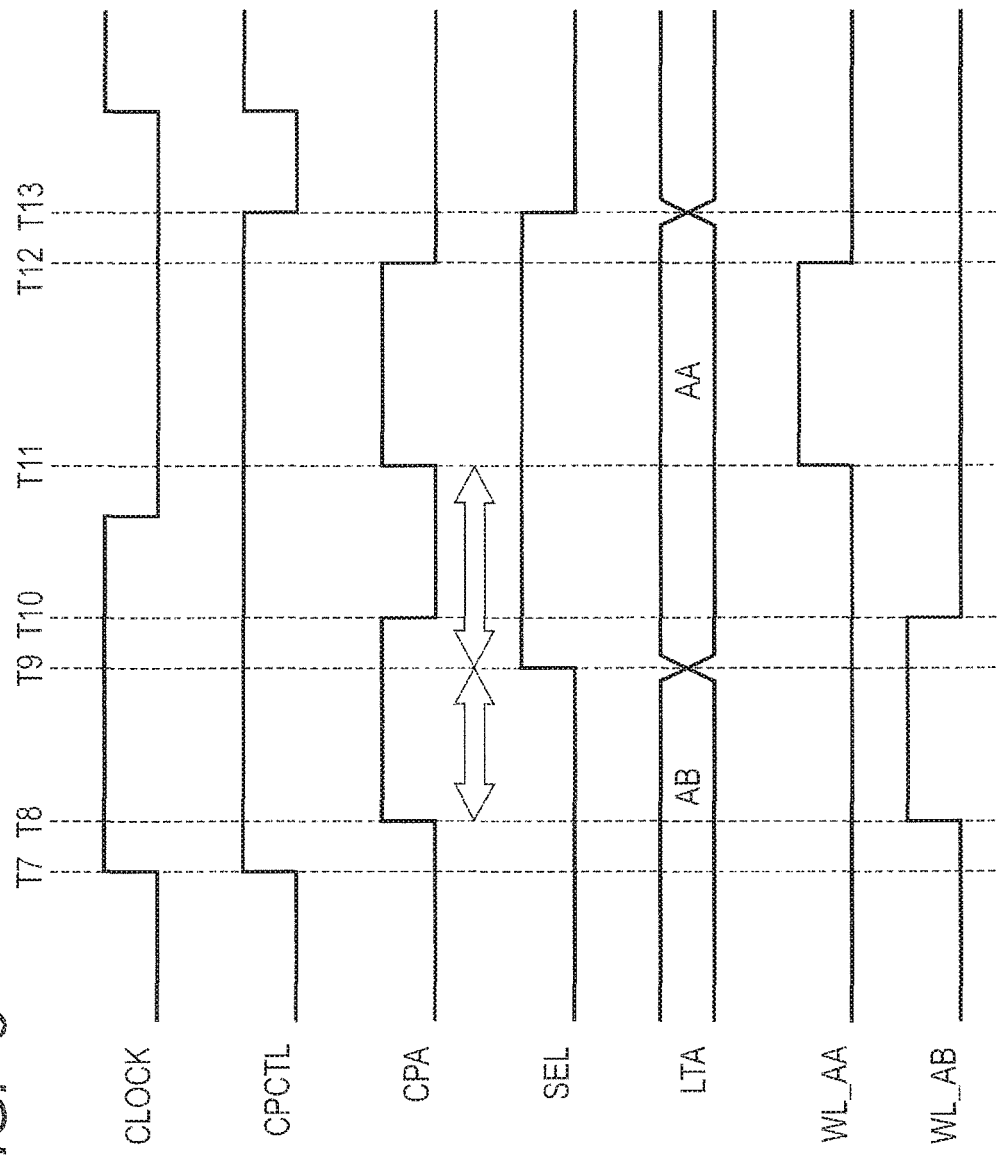
FIG. 5 is a timing chart illustrating one operational example of the address control circuit in FIG. 4.

FIG. 4 is a circuit diagram illustrating one configurational example of the address control circuit 10 and FIG. 5 is a timing chart illustrating one operational example of the address control circuit 10.

The address control circuit 10 includes two latch circuits 1 and 2, a selection circuit 3, the decode circuit 4, the word line drive circuit 5 and so forth. The address signals AA and AB of two systems are input into the address control circuit 10 through the two ports (an A port and a B port) and are output to word lines which includes illustrated word lines WL_AA and WL_AB. Although the address signals AA and AB each is configured by the plurality of bits, only circuits each for one bit are illustrated. CPCTL, SEL and CPA denote the control signals which are generated by the control circuit (CTRL) 11. While in the address control circuit 10 which has been illustrated as the investigation example in FIG. 6, the address signals AA and Ab are once latched respectively by the latch circuits 1 and 2 and thereafter selected by the selection circuit 3, in the address control circuit 10 according to the first embodiment, while the address signal AA is once latched by the latch circuit 1 and is thereafter input into the selection circuit 3, the address signal AB is directly input into the selection circuit 3 without passing through the latch circuit.

The selection circuit 3 outputs one of the once latched address signal AA and the address signal AB which has been directly input into the selection circuit 3 without passing through the latch circuit to the latch circuit 2 as an internal address signal LTA on the basis of the selection control signal ESL, latches the signal LTA by the latch circuit 2 and then supplies the signal LTA to the decode circuit 4. Also an address signal of other bits whose illustration is omitted is input into the decode circuit 4 and the decode circuit 4 decodes the signal so supplied and selects one of the plurality of word lines. The selected word line is a word line which corresponds to a value of the address signal concerned and is driven by the word line drive circuit 5. The control signal CPA is a control signal on the basis of which a timing for driving the word line is controlled.

Figure 6:
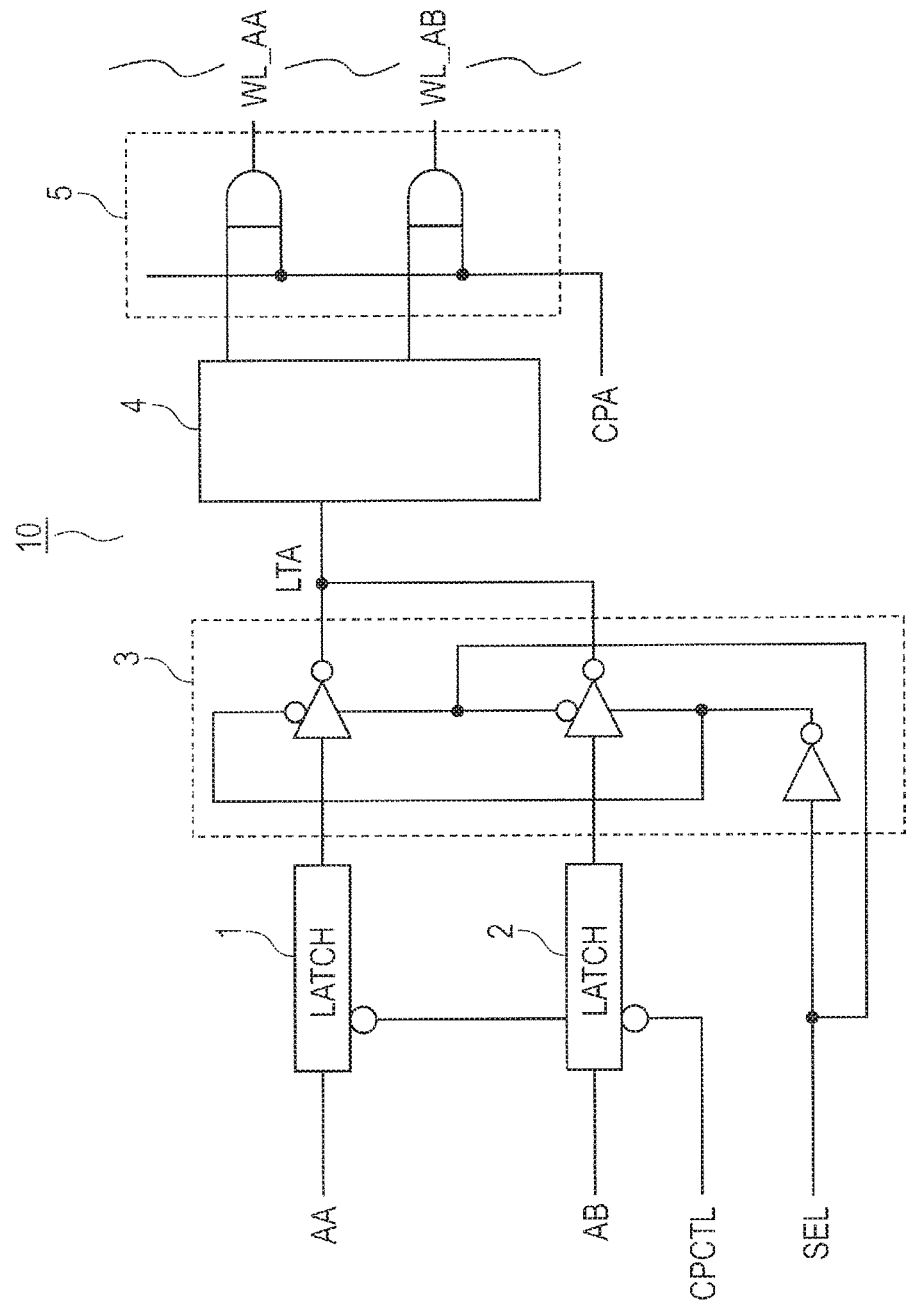
FIG. 6 is a circuit diagram illustrating one configurational example of an address control circuit used for investigations of the matters to be solved which are common between related art pseudo 2-port SRAMs.
Figure 7:
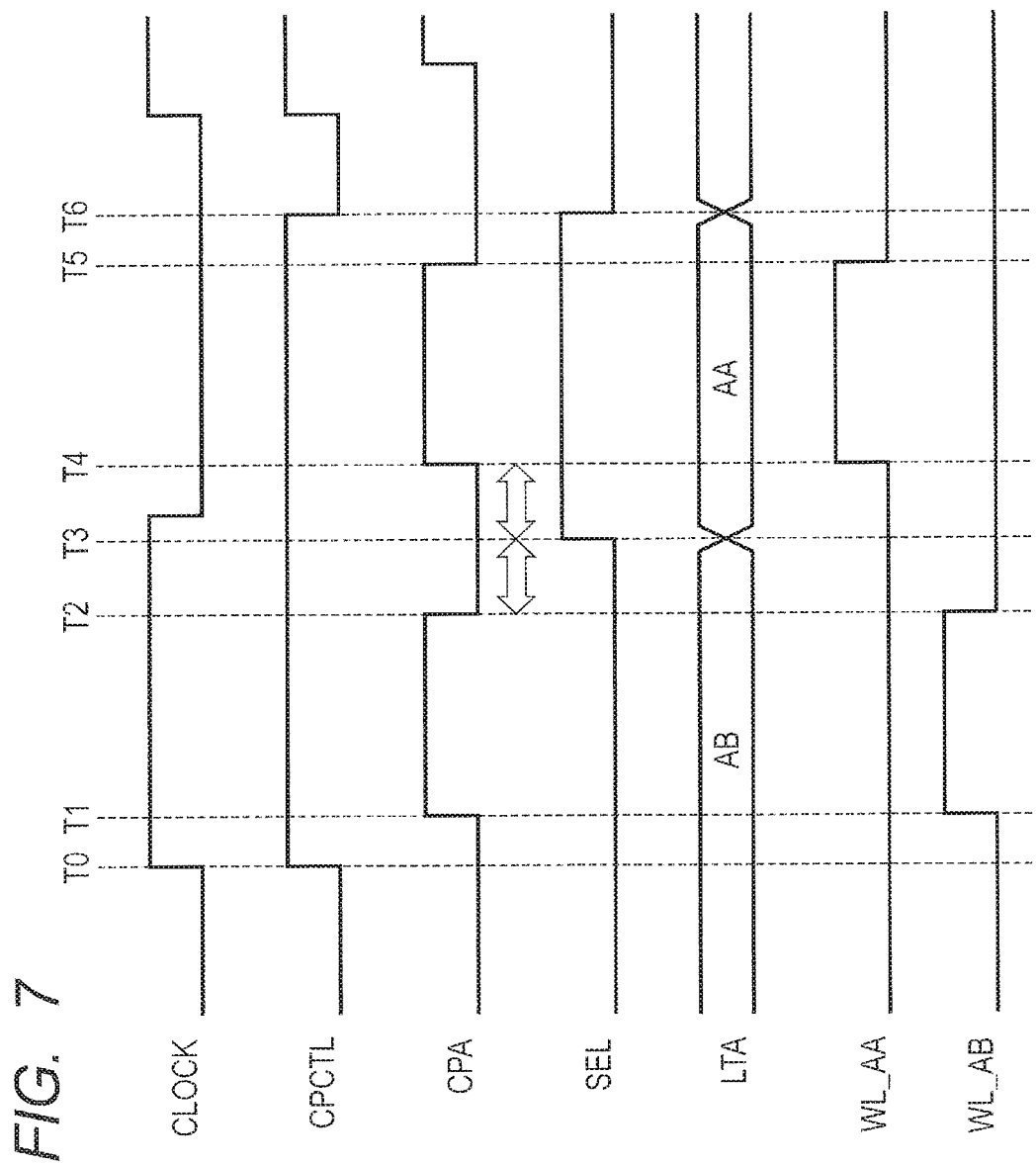
FIG. 7 is a timing chart illustrating one operational example of the address control circuit in FIG. 6.

In the address control circuit 10 which has been illustrated as the investigation example in FIG. 6, as described with reference to FIG. 7, the timing constraints on the setup time and the hold time between the selection control signal SEL to be input into the selection circuit 3 and the control signal CPA for controlling the timing of driving the word line are strict and the strict timing constraints hinder promotion of improvement of the operating frequency. On the other hand, in the first embodiment, the separation control signal SEL is processed separately from the control signal CPA by inserting the latch circuit 2 between the selection circuit 3 which operates on the basis of the selection control signal SEL and the word line drive circuit 5 which drives the word line on the basis of the control signal CPA and therefore it is possible to relax the timing constraints on the setup time and the hold time.

Thereby, in the multiport memory which includes the single memory port which operates as the plurality of ports pseudoly, the timing constraints are relaxed and thereby it is possible to improve the operating frequency of the multiport memory.

The operation of the address control circuit 10 will be described in more detail with reference to FIG. 5.

First, at a time T7, the outer clock signal CLOCK rises. Thereby, the address latch control signal CPCTL is activated and the address signal AA is latched by the latch circuit 1.

Then, at a time T8, the word line control signal CPA is activated. At this time, since the selection control signal SEL is at the Low level, the selection circuit 3 selects the B port side and the B port side address signal AB is output as the internal address signal LTA. In association with this operation, the address signal AB is latched by the latch circuit 2, the latched address signal AB is decoded by the decode circuit 4 and the word line WL_AB which corresponds to the address signal AB is driven and activated by the word line drive circuit 5.

Here, since the latch circuit 2 latches the address signal AB, the selection control signal SEL is allowed to transition to the High level immediately after the defined hold time has elapsed from the time T8. When the selection control signal SEL transitions to the High level at a time T9, the address signal AA is supplied as the internal address signal LTA. Then, at a time T10, the word line control signal CPA is inactivated and the word line WL_AB is inactivated. In addition, the latch circuit 2 enters the through state and the address signal AA is input into the decode circuit 4 via the latch circuit 2.

The input address signal AA is decoded by the decode circuit 4. When, at a time T11, the word line control signal CPA is activated, the word line WL_AA which corresponds to the address signal AA is driven and activated by the word line drive circuit 5. In addition, at this time, the address signal AA is latched by the latch circuit 1.

Then, at a time T12, the word line control signal CPA is inactivated and the word line WL_AA is inactivated. In addition, the latch circuit 2 returns to the through state. Then, at a time T13, the address latch control signal CPCTL is inactivated and the latch circuit 1 returns to the through state. In addition, the selection control signal SEL transitions to the Low level and returns to the initial state.

As a result of the foregoing, the operation in one cycle of the pseudo 2-port SRAM is terminated.

As described above, in the first embodiment, it is sufficient for the selection control signal SEL to simply satisfy the setup time and the hold time respectively for the first-time and second-time transitions of the word line control signal CPA from the Low level to the High level. That is, after the word line control signal CPA has transitioned from the Low level to the High level (the time T8), when the predetermined hold time is satisfied, it is possible to switch the selection control signal SEL from the Low level to the High level. At this switch timing, it is sufficient to simply satisfy the predetermined setup time before the time T11 at which the word line control signal CPA transitions from the Low level to the High level the next time. Since the restraint on the switch timing of the selection control signal SEL is greatly relaxed in this way, it is possible to improve the frequency performance of the memory unit MEMU 20.

Incidentally, although in the first embodiment, the pseudo 2-port SRAM has been described by way of example, it is also possible to apply the present invention to a pseudo multiport memory which performs a plurality of accessing operations in one cycle similarly. In this case, the memory array (MARY) 12 and the memory cell MC may be appropriately changed to devices of other types, and further the data input-output circuit (IO) 13 and the control circuit (CTRL) 11 may be appropriately changed to circuits of other types as requested. For example, the memory cell MC may be changed from the 6-transistor SRAM memory cell which is illustrated in FIG. 2 to a memory cell of a memory of any one of forms such as an electrically rewritable nonvolatile memory and so forth such as the SRAM of another circuit configuration, a DRAM (Dynamic Random Access Memory), a ROM (Read Only Memory), a flash memory and so forth.

Second Embodiment

The various control signals including the word line control signal CPA are generated from the external clock signal CLOCK in the control circuit (CTRL) 11. A configurational example of a clock generation circuit which generates the word line control signal CPA will be described in more detail.

Figure 8:
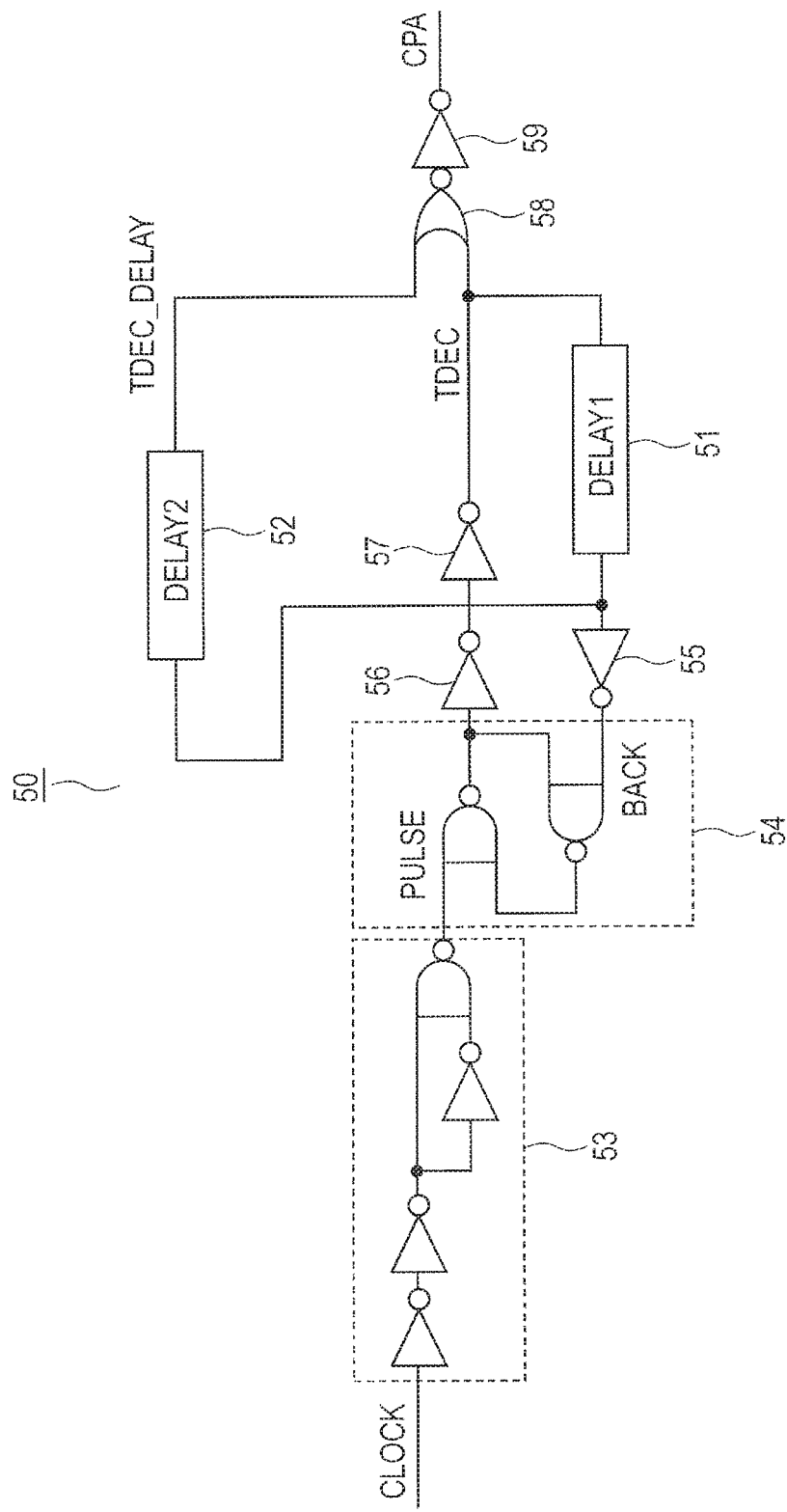
FIG. 8 is a circuit diagram illustrating one configurational example of a clock generation circuit according to a second embodiment of the present invention.

FIG. 8 is a circuit diagram illustrating one configurational example of a clock generation circuit 50. Although the clock generation circuit 50 is built in the control circuit (CTRL) 11, illustration thereof is omitted in FIG. 1.

The clock generation circuit 50 includes a pulse generation circuit 53, an RS (Reset/Set) latch 54, two delay circuits 51 and 52 and other logic gate circuits (inverters and an NOR circuit) 55 to 59. In FIG. 8, "DELAY 1" and "DELAY 2" indicate delay times which have been respectively set for the delay circuits 51 and 52.

The pulse generation circuit 53 generates a one-shot pulse signal PULSE in synchronization with a rising edge of the external clock signal CLOCK which is input. The RS latch 54 is set by the one-shot pulse signal PULSE and makes the decode start-up signal (the control signal) TDEC transition to the High level via, for example, the inverters 56 and 57. The decode start-up signal TDEC is input into the RS latch 54 as a feedback signal BACK via the delay circuit 51 and the inverter 55. The RS latch 54 is reset with the feedback signal BACK and makes the decode start-up signal TDEC transition to the Low level. The decode start-up signal TDEC is delayed by the delay circuit 51 and is further delayed by the delay circuit 52 and thereby a delayed decode start-up signal TDEC_DELAY is generated. The decode start-up signal TDEC and the delayed decode start-up signal TDEC_DELAY are input into the NOR circuit 58 and the inverter 59 to generate the word line control signal CPA.

The operation of the clock generation circuit 50 will be described in more detail.

Figure 9:
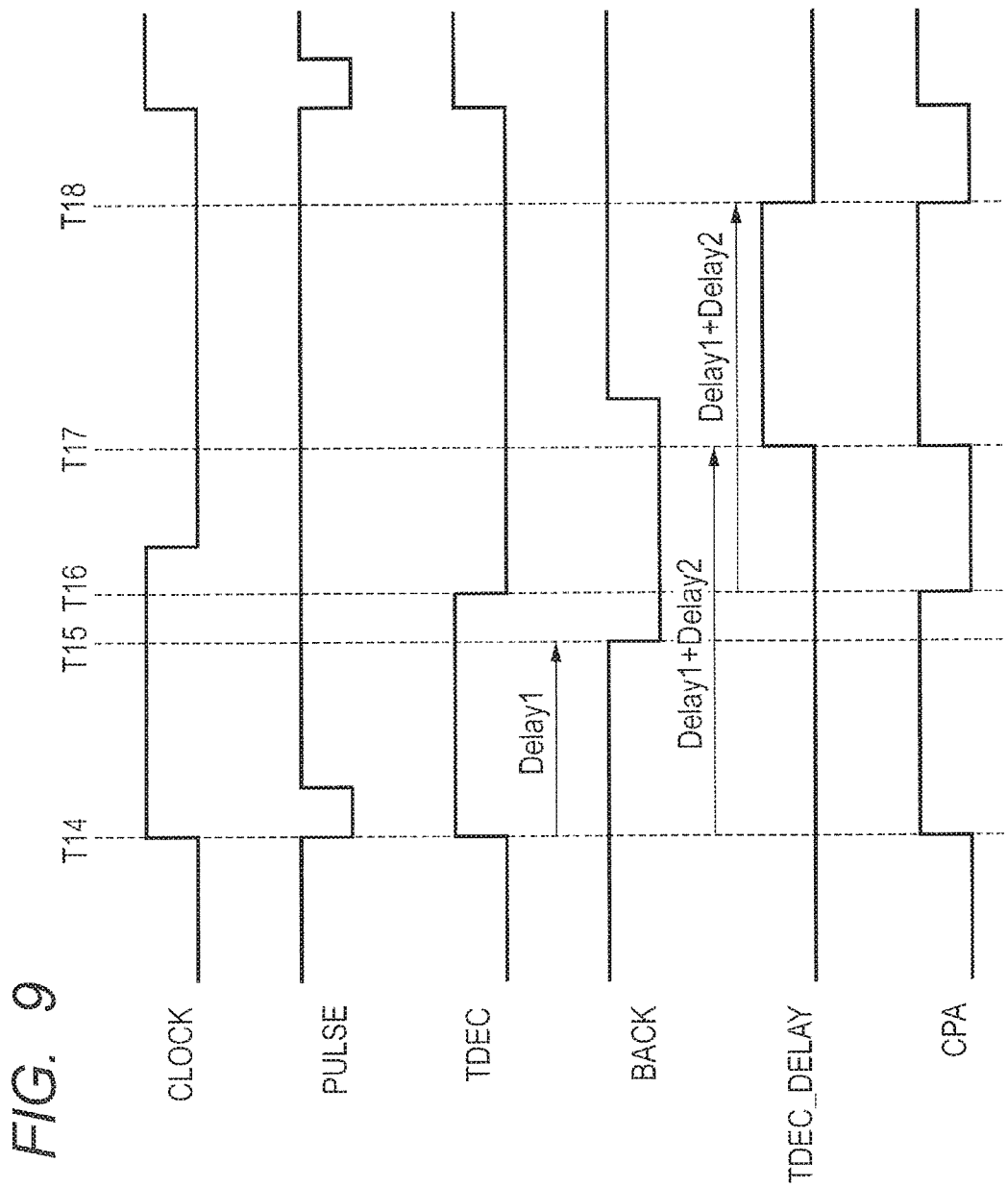
FIG. 9 is a timing chart illustrating one operational example of the clock generation circuit in FIG. 8.

FIG. 9 is a timing chart illustrating one operational example of the clock generation circuit 50 in FIG. 8.

First, at a time T14, the external clock signal CLOCK rises. A rising edge of the external clock signal CLOCK is triggered and thereby the one-shot pulse signal PULSE is generated by the pulse generation circuit 53. The RS latch 54 is set with this one-shot pulse signal PULSE and the decode start-up signal TDEC is activated. Also the word line control signal CPA is activated in response to the above-mentioned operation.

Since the decode start-up signal TDEC is being supplied to the delay circuit 51, the feedback signal BACK transitions to the Low level at a time T15 which comes after the delay time (Delay1) set by the delay circuit 51 has elapsed. Thereby, the RS latch 54 is reset and the decode start-up signal TDEC is inactivated at a time T16. Here, a delay from the time T15 to the time T16 is a comparatively small delay of the amount corresponding to three stages of gates. When the decode start-up signal TDEC is inactivated, also the word line control signal CPA is inactivated. Then, the feedback signal BACK transitions to the High level and returns to the initial state.

On the other hand, the decode start-up signal TDEC is also supplied to the delay circuit 52 via the delay circuit 51. The delayed decode start-up signal TDEC_DELAY rises behind the decode start-up signal TDEC at a time T17 which comes after the delay time (Delay1) set by the delay circuit 51 has elapsed from the time T14 at which the decode start-up signal TDEC rises and then after the delay time (Delay2) set by the delay circuit 52 has elapsed. In addition, the delayed decode start-up signal TDEC_DELAY falls at a time T18 which comes after the sum of the same delay times Delay1 and Delay2 has elapsed from the time T16 at which the decode start-up signal TDEC falls. In association with the above-mentioned operations, also the word line control signal CPA is activated at the time T17 and then is inactivated at the time T18.

As described above, in the second embodiment, the word line control signal CPA is activated two times by utilizing only the rising edge of the external clock signal CLOCK. That is, it is possible to generate the control signals including the internal clock signal used for activation which is performed two times in one cycle of the external clock signal CLOCK in the pseudo 2-port SRAM without utilizing a falling edge of the external clock signal CLOCK.

Thereby, the restraint on the High/Low periods of the external clock signal CLOCK is relaxed and thereby it is possible to improve the frequency performance of the pseudo 2-port SRAM.

Third Embodiment

Figure 10:
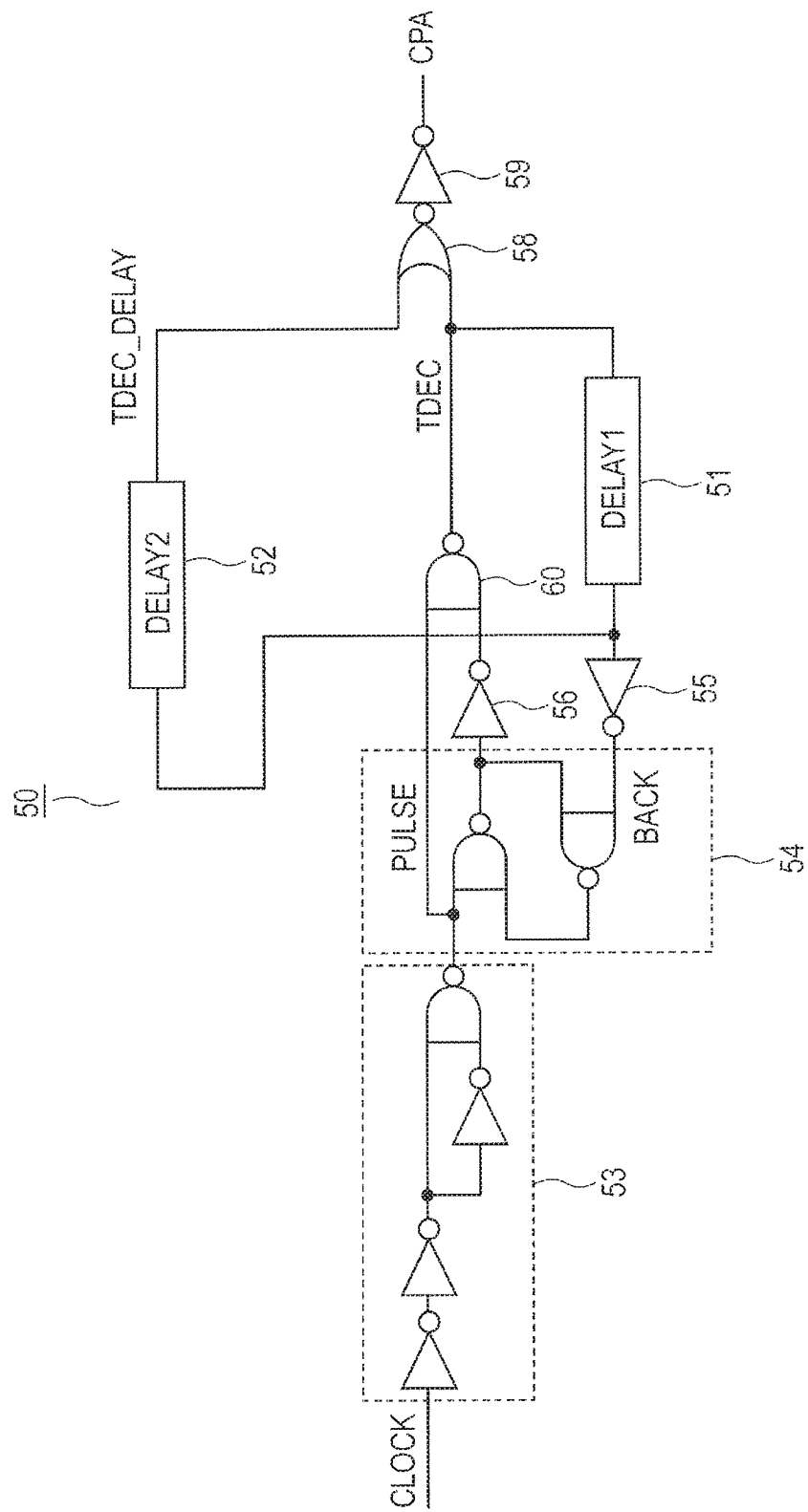
FIG. 10 is a circuit diagram illustrating another configurational example of the clock generation circuit according to a third embodiment of the present invention.
Figure 11:
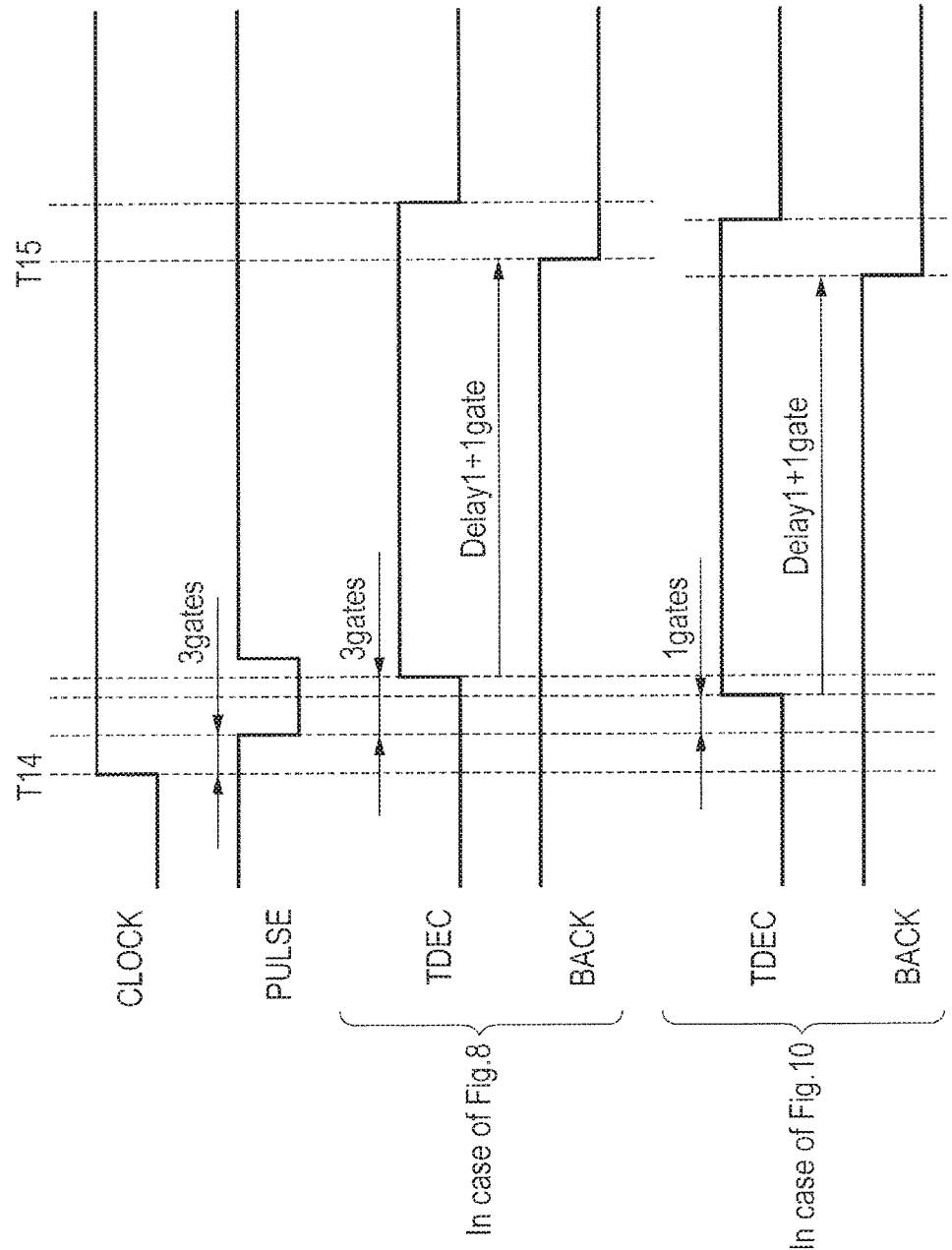
FIG. 11 is a timing chart illustrating one operational example of the clock generation circuit in FIG. 10.

FIG. 10 is a circuit diagram illustrating another configurational example of the clock generation circuit 50 and FIG. 11 is a timing chart illustrating one operational example thereof. In the clock generation circuit 50 in FIG. 10, the inverter 57 in the clock generation circuit 50 according to the second embodiment illustrated in FIG. 8 is changed to a NAND circuit 60 so as to allow direct inputting of the one-shot pulse signal PULSE without passing through the RS latch 54. Other configurations are the same as those of the clock generation circuit 50 according to the second embodiment.

The operation of the clock generation circuit 50 will be described.

In the timing chart in FIG. 11, the period between the time T14 and the time T5 in the timing chart in FIG. 9 is enlargedly illustrated so as to indicate even a one-gate delay in detail and thereby to indicate a difference in operation timing between the clock generation circuit 50 according to the second embodiment and the clock generation circuit 50 according to the third embodiment.

When the external clock signal CLOCK rises at the time T14, the one-shot pulse signal PULSE transitions to the Low level after a three-gate delay time has elapsed from the time T14.

In the clock generation circuit 50 according to the second embodiment, the decode start-up signal TDEC rises after the three-gate delay time has elapsed in response to this operation. Further, the feedback signal BACK transitions to the Low level at the time T15 which comes after the delay time Delay1 and a one-gate delay time have elapsed. The decode start-up signal TDEC transitions to the Low level in association with this operation.

On the other hand, in the clock generation circuit 50 according to the third embodiment, the decode start-up signal TDEC rises after the one-gate delay time has elapsed after transition of the one-shot pulse signal PULSE to the Low level. Further, the feedback signal BACK transitions to the Low level at a timing which is earlier than the time T15 which comes after the delay time Delay 1 and the one-gate delay time have elapsed. The decode start-up signal TDEC transitions to the Low level in association with this operation. It is possible to make the decode start-up signal TDEC and the word line control signal CPA though illustration thereof is omitted in FIG. 11 at the timings which are earlier than those by the clock generation circuit 50 according to the second embodiment.

Thereby, speeding-up of operations from rising of the external clock signal CLOCK to activation of the decode start-up signal TDEC becomes possible and it becomes possible to improve the frequency performance and an access time performance of the pseudo 2-port SRAM.

Fourth Embodiment

The pseudo 2-port SDRAM of the type that the memory array is configured by the single-port SRAM so as to operate as the 2-port memory pseudoly by performing accessing two times in the one-cycle period of the external clock signal CLOCK by the address control circuit 10 has been described above. Since it is the technology of making one physical port pseudoly function as the plurality of ports, when the memory array is configured as a physical multiport memory array, it is possible to make each port function as two ports pseudoly.

Figure 12:
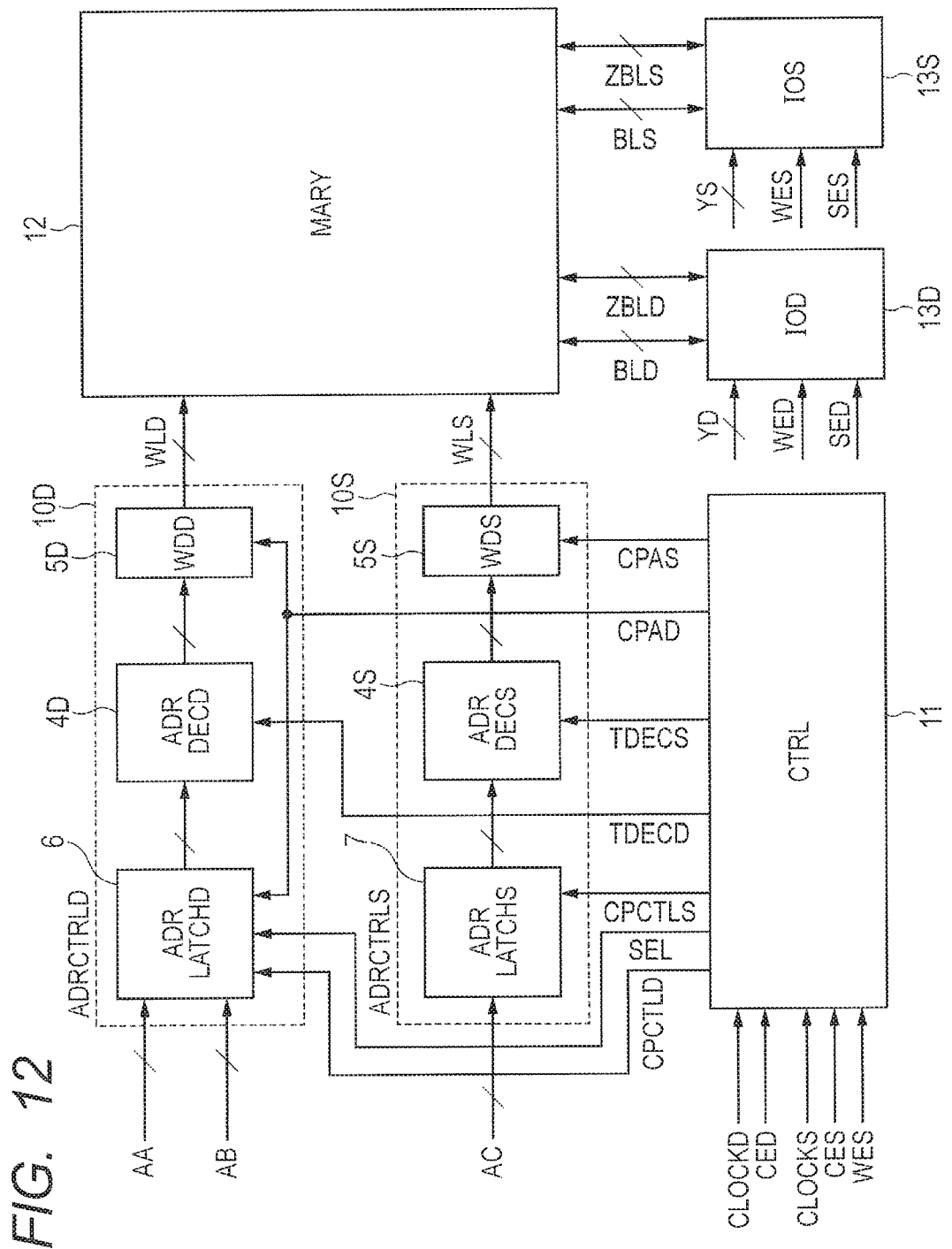
FIG. 12 is a block diagram illustrating one configurational example of a multiport memory which includes pseudo two ports according to a fourth embodiment of the present invention.

FIG. 12 is a block diagram illustrating one configurational example of a multiport memory which includes the two pseudo ports. The multiport memory includes the 2-port memory array (MARY) 12, address control circuits (ADRCTRLD and ADRCTRLS) 10D and 10S, data input-output circuits (IOD and IOS) 13D and 13S, the control circuit (CTRL) 11 and so forth. The memory array (MARY) 12 is configured as the 2-port memory array that one port is configured to function as two ports pseudoly and the other port remains as a single port. Thereby, the multiport memory functions as a 3-port memory.

The address control circuit (ADRCTRLD) 10D is coupled to a word line WLD on the side of the memory array (MARY) 12 that the port is configured to function as the two ports pseudoly and the data input-output circuit (IOD) 13D is coupled to a bit line pair BLD/ZBLD.

The address control circuit (ADRCTRLS) 10S is coupled to a word line WLS on the single port side of the memory array (MARY) 12 and the data input-output circuit (IOS) 13S is coupled to a bit line pair BLS/ZBLS.

The address signals AA and AB, and also a clock signal CLOCKD and a chip enable signal CED (signals CENA and CENB are also included) are input into the side of the multiport memory that the port is configured to function as the two ports pseudoly. On the other hand, an address signal AC, a clock signal CLOCKB, a chip enable signal CES and a write enable signal WES are input into the single port side of the multiport memory.

The address control circuit (ADRCTRLD) 10D on the side that one port is configured to function as the two ports pseudoly is the same as the address control circuit 10 illustrated in FIG. 1 and FIG. 4 in configuration and includes a latch circuit (ADRLATCHD) 6D, a decode circuit (ADRDECD) 4D and a word line control circuit (WDD) 5D. The data input-output circuit (IOD) 13D is the same as the data input-output circuit (IO) 13 illustrated in FIG. 1. The control circuit (CTRL) 11 generates various control signals CPCTLD, SELD, TDECD, CPAD, WED, SED and so forth on the basis of the clock signal CLOCKD and the chip enable signals CED (CENA, CENB) which are input and supplies the generated control signals to the address control circuit (ADRCTRLD) 10D and the data input-output circuit (IOD) 13D.

The single port side is the same as that of the general single-port memory. The address control circuit (ADRCTRLS) 10S includes a latch circuit (ADRLATCHS) 7, a decode circuit (ADRDECS) 4S and a word line drive circuit (WDS) 5S and drives a word line WLS which corresponds to the address signal AC which is input. The data input-output circuit (IOS) 13S is also the same as the data input-output circuit of the general single-port memory. The control circuit (CTRL) 11 generates various control signals CPCTLS, TDECS, CPAS, WES, SES and so forth on the basis of the clock signal CLOCKS, the chip enable signal CES and the write enable signal WES which are input and supplies the generated control signals to the address control circuit (ADRCTRLS) 10S and the data input-output circuit (IOS) 13S.

In the multiport memory array (MARY) 12, since it is possible to operate the two ports asynchronously in this way, it is possible to realize the multiport configuration by combining the side that one port is made to function as the two ports pseudoly with the single port side. Both of the two ports may be made to function respectively as the two ports pseudoly. The same also applies to multiport memory arrays having three or more ports.

It is possible to configure the multiport memory array (MARY) 12 by using various multiport memory cells.

Figure 13:
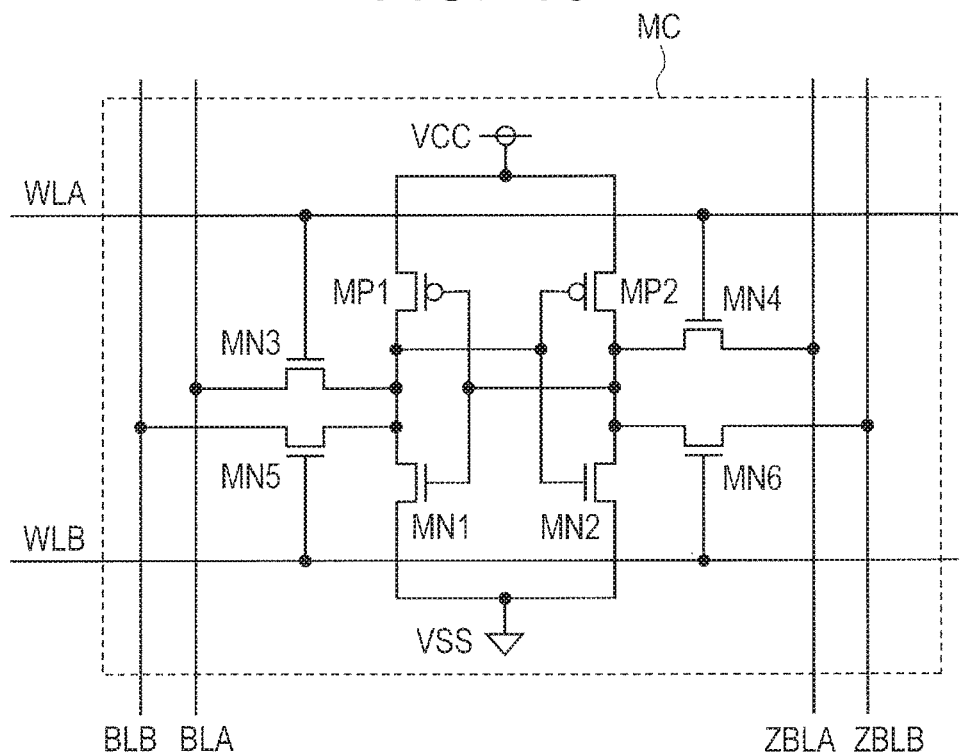
FIG. 13 is a circuit diagram illustrating one configurational example of a dual-port SRAM memory cell which is configured by eight transistors.

FIG. 13 is a circuit diagram illustrating one configurational example of a dual-port SRAM memory cell which is one example of the multiport memory cell and is configured by eight transistors. That is, further two N channel MOS transistors MN5 and MN6 are added to the single-port SRAM memory cell illustrated in FIG. 2. A word line WLA and a bit line pair BLA/ZBLA are coupled to the N channel MOS transistors MN3 and MN4. A word line WLB and a bit line pair BLB/ZBLB which are arranged in correspondence with the other port are coupled to the added N channel MOS transistors MN5 and MN6. The two ports are independent of each other and make asynchronous data reading from and writing into the memory cells possible. However, when the data writing operations are competitively performed on the same memory cell or the data reading operation and the data writing operation are competitively performed on the same memory cell, as a matter of course, arbitration by a well-known technology is performed.

Figure 14:
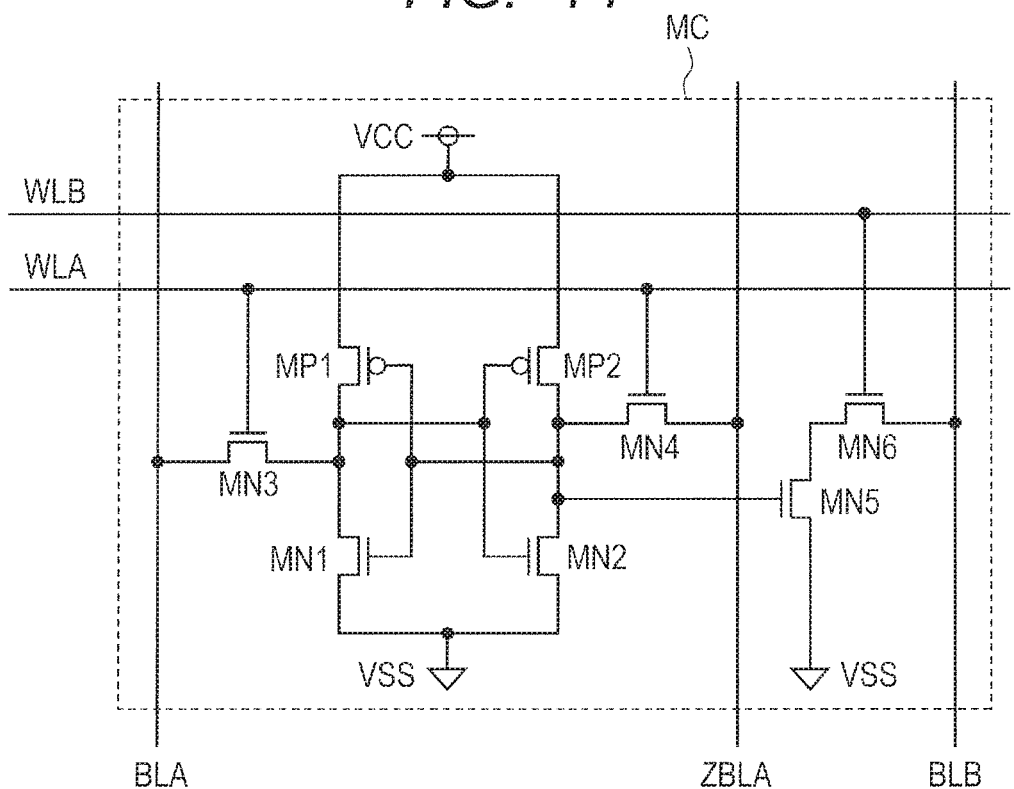
FIG. 14 is a circuit diagram illustrating another configurational example of the dual port SRAM memory cell which is configured by the eight transistors.

FIG. 14 is a circuit diagram illustrating another configurational example of the dual-port SRAM memory cell which is configured by the eight transistors. Further the two N channel MOS transistors MN5 and MN6 are added to the single-port SRAM memory cell illustrated in FIG. 2. The word line WLA and the bit line pair BLA/ZBLA are coupled to the N channel MOS transistors MN3 and MN4. The word line WLB and a bit line BLB which are arranged in correspondence with the other port are coupled to the added N channel MOS transistors MN5 and MN6. The added port is a read only port. In this case, also the data input-output circuit (IO) 13 is changed in accordance with this configuration.

Although description has been made on the assumption that the two ports to be made to function respectively as the two ports pseudoly are the write port and the read port in the first to third embodiments, it is also possible to make the two read ports or the two write ports to function respectively as the two ports pseudoly by combination with the other port as in the fourth embodiment.

Thereby, it becomes possible to expand the multiport memory so as to have many ports, not limiting the number of ports to two.

Although the invention which has been made by the inventors and others has been specifically described on the basis of the embodiments thereof as mentioned above, it goes without saying that the present invention is not limited to the above-mentioned embodiments and may be altered and modified in a variety of ways within a range not deviating from the gist of the present invention.

For example, block division illustrated in each block diagram is merely one example and it is possible to appropriately and optionally make an alteration which is realized by altering one block to another block that some or all functions in one block have been realized so as to be harmoniously integrated with functions of another block. In addition, selective and proper use of the positive logic and the negative logic in the signal lines and the circuits and described in the specification and illustrated in the drawings and the circuit configurations thereof are merely examples and may be optionally changed to other signal lines and other circuits which realize the same functions.

What is claimed is:

1. A multiport memory comprising:
    an address control circuit;
    a memory array;
    a data input-output circuit; and
    a control circuit,
    first and second address signals and a clock signal being input so as to make inputting and/or outputting of data possible,
    wherein the address control circuit includes a first latch circuit into which the first address signal is input, a selection circuit which selects and outputs an output signal from the first latch circuit or the second address signal, a second latch circuit into which an output signal from the selection circuit is input, a decode circuit which decodes an output signal from the second latch circuit, and a word line drive circuit which drives a word line on the basis of an output signal from the decode circuit, and
    wherein one address signal which has been selected by the selection circuit in the first and second address signals is decoded by the decode circuit and thereby one of a plurality of word lines that the memory array includes is selected, the word line drive circuit drives and thereby activates the selected word line, and the data input-output circuit sets one memory cell which is selected by the activated one word line in a plurality of memory cells that the memory array includes as an object into and/or from which the data is input and/or output.

2. The multiport memory according to claim 1,
    wherein the control circuit generates a word line control signal adapted to activate the word line two times per one period of the clock signal from the clock signal,
    wherein the word line drive circuit drives the selected word line at a timing which is based on the word line control signal, and
    wherein the second latch circuit latches the output signal from the selection circuit at the timing which is based on the word line control signal.

3. The multiport memory according to claim 2,
    wherein the control circuit includes a pulse generation circuit, a reset-set latch circuit, first and second delay circuits and a logic circuit,
    wherein the pulse generation circuit generates a one-shot pulse signal in synchronization with a transition timing of rising or falling of the clock signal,
    wherein the reset-set latch circuit generates a first pulse signal which is set with the one-shot pulse signal and is reset with a feedback signal,
    wherein the first delay circuit generates the feedback signal by delaying the first pulse signal,
    wherein the second delay circuit generates a second pulse signal by delaying the first pulse signal which has been delayed by the first delay circuit, and
    wherein the logic circuit generates the word line control signal from the first pulse signal and the second pulse signal.

4. The multiport memory according to claim 2,
    wherein the control circuit includes a pulse generation circuit, a reset-set latch circuit, first and second delay circuits and first and second logic circuits,
    wherein the pulse generation circuit generates a one-shot pulse signal in synchronization with a transition timing of rising or falling of the clock signal,
    wherein the reset-set latch circuit generates a third pulse signal which is set with the one-shot pulse signal and is reset with a feedback signal,
    wherein the first logic circuit generates a first pulse signal from the one-shot pulse signal and the third pulse signal,
    wherein the first delay circuit generates the feedback signal by delaying the first pulse signal,
    wherein the second delay circuit generates a second pulse signal by delaying the first pulse signal which has been delayed by the first delay circuit, and
    wherein the second logic circuit generates the word line control signal from the first pulse signal and the second pulse signal.

5. The multiport memory according to claim 1,
    wherein the address control signal circuit is set as a first address control circuit, the decode circuit is set as a first decode circuit, the word line drive circuit is set as a first word line drive circuit, the clock signal is set as a first clock signal, the word line is set as a first word line, and the memory array further includes a plurality of second word lines in addition to a plurality of the first word lines,
    wherein the multiport memory further comprises a second address control circuit and a second clock signal and a third address signal are further input into the multiport memory, and
    wherein the second address control circuit includes a third latch circuit which latches the third address signal in synchronization with the second clock signal, a second decode circuit which decodes the third address signal which has been latched by the third latch circuit, and a second word line drive circuit which selects and drives one of the second word lines that the memory array includes on the basis of an output signal from the second decode circuit.

6. A memory macro including a plurality of first address terminals into which a first address signal is input, a plurality of second address terminals into which a second address signal is input and a clock terminal into which a clock signal is input, comprising:
an address control circuit;
a memory array;
a data input-output circuit; and
a control circuit,
the first and second address signals and the clock signal being input so as to make inputting and/or outputting of data possible,
wherein the address control circuit includes a first latch circuit into which the first address signal is input, a selection circuit which selects and outputs an output signal from the first latch circuit or the second address signal, a second latch circuit into which an output signal from the selection circuit is input, a decode circuit which decodes an output signal from the second latch circuit, and a word line drive circuit which drives a word line on the basis of an output signal from the decode circuit, and
wherein one address signal which has been selected by the selection circuit in the first and second address signals is decoded by the decode circuit and thereby one of a plurality of word lines that the memory array includes is selected, the word line drive circuit drives and thereby activates the selected word line, and the data input-output circuit sets one memory cell which is selected by the activated one word line in a plurality of memory cells that the memory array includes as an object into and/or from which the data is input and/or output.

7. The memory macro according to claim 6,
wherein the control circuit generates a word line control signal adapted to activate the word line two times per one period of the clock signal from the clock signal,
wherein the word line drive circuit drives the selected word line at a timing which is based on the word line control signal, and
wherein the second latch circuit latches the output signal from the selection circuit at the timing which is based on the word line control signal.

8. The memory macro according to claim 7,
wherein the control circuit includes a pulse generation circuit, a reset-set latch circuit, first and second delay circuits and a logic circuit,
wherein the pulse generation circuit generates a one-shot pulse signal in synchronization with a transition timing of rising or falling of the clock signal,
wherein the reset-set latch circuit generates a first pulse signal which is set with the one-shot pulse signal and is reset with a feedback signal,
wherein the first delay circuit generates the feedback signal by delaying the first pulse signal,
wherein the second delay circuit generates a second pulse signal by delaying the first pulse signal which has been delayed by the first delay circuit, and
wherein the logic circuit generates the word line control signal from the first pulse signal and the second pulse signal.

9. The memory macro according to claim 7,
wherein the control circuit includes a pulse generation circuit, a reset-set latch circuit, first and second delay circuits and first and second logic circuits,
wherein the pulse generation circuit generates a one-shot pulse signal in synchronization with a transition timing of rising or falling of the clock signal,
wherein the reset-set latch circuit generates a third pulse signal which is set with the one-shot pulse signal and is reset with a feedback signal,
wherein the first logic circuit generates a first pulse signal from the one-shot pulse signal and the third pulse signal,
wherein the first delay circuit generates the feedback signal by delaying the first pulse signal,
wherein the second delay circuit generates a second pulse signal by delaying the first pulse signal which has been delayed by the first delay circuit, and
wherein the second logic circuit generates the word line control signal from the first pulse signal and the second pulse signal.

10. The memory macro according to claim 6,
wherein the address control signal circuit is set as a first address control circuit, the decode circuit is set as a first decode circuit, the word line drive circuit is set as a first word line drive circuit, the clock signal is set as a first clock signal, the word line is set as a first word line, and the memory array further includes a plurality of second word lines in addition to a plurality of the first word lines,
wherein the memory macro further includes a plurality of third address terminals into which a third address signal is input and a second clock terminal into which a second clock signal is input, and further comprises a second address control circuit, and
wherein the second address control circuit includes a third latch circuit which latches the third address signal in synchronization with the second clock signal, a second decode circuit which decodes the third address signal which has been latched by the third latch circuit, and a second word line drive circuit which selects and drives one of the second word lines that the memory array includes on the basis of an output signal from the second decode circuit.

11. A semiconductor device comprising:
a multiport memory which includes an address control circuit, a memory array, a data input-output circuit and a control circuit and into which first and second address signals and a clock signal are input so as to make inputting and/or outputting of data possible,
wherein the address control circuit includes a first latch circuit into which the first address signal is input, a selection circuit which selects and outputs an output signal from the first latch circuit or the second address signal, a second latch circuit into which an output signal from the selection circuit is input, a decode circuit which decodes an output signal from the second latch circuit, and a word line drive circuit which drives a word line on the basis of an output signal from the decode circuit, and
wherein one address signal which has been selected by the selection circuit in the first and second address signals is decoded by the decode circuit and thereby one of a plurality of word lines that the memory array includes is selected, the word line drive circuit drives and thereby activates the selected word line, and the data input-output circuit sets one memory cell which is selected by the activated one word line in a plurality of memory cells that the memory array includes as an object into and/or from which the data is input and/or output.

12. The semiconductor device according to claim 11,
wherein the control circuit generates a word line control signal adapted to activate the word line two times per one period of the clock signal from the clock signal,
wherein the word line drive circuit drives the selected word line at a timing which is based on the word line control signal, and
wherein the second latch circuit latches the output signal from the selection circuit at the timing which is based on the word line control signal.

13. The semiconductor device according to claim 12,
wherein the control circuit includes a pulse generation circuit, a reset-set latch circuit, first and second delay circuits and a logic circuit,
wherein the pulse generation circuit generates a one-shot pulse signal in synchronization with a transition timing of rising or falling of the clock signal,
wherein the reset-set latch circuit generates a first pulse signal which is set with the one-shot pulse signal and is reset with a feedback signal,
wherein the first delay circuit generates the feedback signal by delaying the first pulse signal,
wherein the second delay circuit generates a second pulse signal by delaying the first pulse signal which has been delayed by the first delay circuit, and
wherein the logic circuit generates the word line control signal from the first pulse signal and the second pulse signal.

14. The semiconductor device according to claim 12,
wherein the control circuit includes a pulse generation circuit, a reset-set latch circuit, first and second delay circuits and first and second logic circuits,
wherein the pulse generation circuit generates a one-shot pulse signal in synchronization with a transition timing of rising or falling of the clock signal,
wherein the reset-set latch circuit generates a third pulse signal which is set with the one-shot pulse signal and is reset with a feedback signal,
wherein the first logic circuit generates a first pulse signal from the one-shot pulse signal and the third pulse signal,
wherein the first delay circuit generates the feedback signal by delaying the first pulse signal,
wherein the second delay circuit generates a second pulse signal by delaying the first pulse signal which has been delayed by the first delay circuit, and
wherein the second logic circuit generates the word line control signal from the first pulse signal and the second pulse signal.

15. The semiconductor device according to claim 11,
wherein the address control signal circuit is set as a first address control circuit, the decode circuit is set as a first decode circuit, the word line drive circuit is set as a first word line drive circuit, the clock signal is set as a first clock signal, the word line is set as a first word line, and the memory array further includes a plurality of second word lines in addition to a plurality of the first word lines,
wherein the multiport memory further includes a second address control circuit and a second clock signal and a third address signal are further input into the multiport memory, and
wherein the second address control circuit includes a third latch circuit which latches the third address signal in synchronization with the second clock signal, a second decode circuit which decodes the third address signal which has been latched by the third latch circuit, and a second word line drive circuit which selects and drives one of the second word lines that the memory array includes on the basis of an output signal from the second decode circuit.

* * * * *